United States Patent [19]
Sachdev et al.

[11] Patent Number: 5,976,710
[45] Date of Patent: Nov. 2, 1999

[54] LOW TCE POLYIMIDES AS IMPROVED INSULATOR IN MULTILAYER INTERCONNECT STRUCTURES

[75] Inventors: Krishna Gandhi Sachdev, Hopewell Junction; John Patrick Hummel, Verbank; Sundar Mangalore Kamath, Hyde Park; Robert Neal Lang, Pleasant Valley; Anton Nendaic, Red Hook; Charles Hampton Perry, Poughkeepsie; Harbans Sachdev, Hopewell Junction, all of N.Y.

[73] Assignee: International Business Machines Corporation, Armonk, N.Y.

[21] Appl. No.: 08/838,757

[22] Filed: Apr. 10, 1997

Related U.S. Application Data

[63] Continuation of application No. 08/447,480, May 23, 1995, abandoned, which is a continuation of application No. 08/109,573, Aug. 19, 1993, abandoned, which is a continuation of application No. 07/740,760, Aug. 5, 1991, abandoned.

[51] Int. Cl.$^6$ .................................................. H01L 29/12
[52] U.S. Cl. .......................... 428/620; 428/623; 428/626; 428/635; 428/458; 428/473.5; 257/40; 257/684; 257/698; 257/702
[58] Field of Search ............................. 257/40, 623, 684, 257/698, 700, 702, 703; 428/623, 635

[56] References Cited

U.S. PATENT DOCUMENTS

| | | | |
|---|---|---|---|
| 4,690,999 | 9/1987 | Numata et al. | 528/188 |
| 4,702,792 | 10/1987 | Chow et al. | 156/628 |
| 4,789,648 | 12/1988 | Chow et al. | 437/225 |
| 4,880,684 | 11/1989 | Boss et al. | 428/209 |
| 4,954,142 | 9/1990 | Carr et al. | 51/309 |
| 5,059,273 | 10/1991 | Boyce et al. | 428/473.5 |
| 5,095,359 | 3/1992 | Tanaka et al. | 357/74 |
| 5,106,667 | 4/1992 | Ochsner et al. | 428/473.5 |
| 5,115,090 | 5/1992 | Sachdev et al. | 528/353 |
| 5,171,828 | 12/1992 | Meterko et al. | 428/473.5 |
| 5,260,413 | 11/1993 | Ochsner et al. | 428/473.5 |
| 5,372,891 | 12/1994 | Yu et al. | 428/473.5 |

FOREIGN PATENT DOCUMENTS

| | | | |
|---|---|---|---|
| 0 286 829 | 3/1988 | European Pat. Off. | H01L 21/312 |
| 0 350 203 | 6/1989 | European Pat. Off. | C08G 73/10 |
| 61 187 346 | 1/1987 | Japan | H01L 21/88 |

OTHER PUBLICATIONS

Y. Misawa, et al. *IEEE Transactions on Electron Devices*, vol. ED–34, No. 3, Mar. 1987.

Birt T. Merriman, et al., *New Location Coefficient of Thermal Expansion Polyimide for Inorganic Substrates*, pp. 155–159.

*Primary Examiner*—David A. Simmons
*Assistant Examiner*—Linda L Gray
*Attorney, Agent, or Firm*—Steven Capella

[57] ABSTRACT

A multilevel high density interconnect structure of a semiconductor device or package including a substrate having at least one conductive feature therein, a film of a polyimide composition on the substrate and selected from the group consisting of a cured product of a polyamic acid and a cured product of a polyamic ester. The polyamic acid is prepared by reacting a stoichiometric excess of a linear aromatic diamine and aromatic dianhydride to form a first reaction product where the molar ratio of said diamine to said aromatic anhydride is in the range from 100:97 to 100:99.5 and then reacting the first reaction product with an aromatic anhydride. The polyamic ester is prepared by reacting a stoichiometric excess of a linear aromatic diamine and an aromatic diester diacyl chloride to form a second reaction product where the molar ratio of said diamine to said diester diacyl chloride is in the range from 100:97 to 100:99.5 and then reacting the second reaction product with aromatic anhydride. There is at least one interconnective conductive metallurgical feature in the film a polyimide composition in contact with said conductive feature in said substrate.

31 Claims, No Drawings

LOW TCE POLYIMIDES AS IMPROVED INSULATOR IN MULTILAYER INTERCONNECT STRUCTURES

This application is a continuation of application Ser. No. 08/447,480 filed May 23, 1995, now abandoned, which is a continuation of application Ser. No. 08/109,573 filed Aug. 19, 1993, now abandoned, which is a continuation of application Ser. No. 07/740,760 filed Aug. 5, 1991, now abandoned.

FIELD OF INVENTION

This invention relates to high density, multilayer interconnect structures having copper, aluminum/copper, tungsten and other metal conductor patterns in low TCE polyimide insulator/dielectric and passivating layers to provide improved performance of interconnect devices including structural integrity during fabrication processes and long term reliability. The invention also relates to the sequential building of planarized multiple layers of interconnection metallurgical patterns embedded in low TCE (Thermal Coefficient of Expansion), low dielectric constant polyimide insulator on semiconductor (usually silicon) substrates and on multilayer ceramic substrates to form composite packaging structures which have lower interfacial stress, lower dielectric constant polyimide insulator, lower defect density, and are free of cracking problems commonly encountered with dissimilar high stress materials having a TCE mismatch.

BACKGROUND ART

Polyimides have been recognized as polymers of choice for passivation and interlayer dielectric in microelectronics for improving the electrical performance characteristics of high density IC devices partly because the organic polymer based insulators have lower dielectric constant compared to the commonly employed inorganic dielectric materials. Use of polyimide insulator also provides process simplification and advantages of having a wide selection of material properties available to meet specific requirements. In high density integrated circuits, faster signal propagation and low cross-talk levels are among some of the important considerations and thus polyimides which have relatively lower dielectric constant and which exhibit many excellent thermal and mechanical properties would be preferred over inorganic dielectrics.

However, the conventional polyimides derived from non-linear aromatic diamine and/or dianhydride precursors such as pyromellitic dianhydride-4,4'-oxydianiline (PMDA-ODA), 3,3'-4,4'-biphenicdianhydride-4,4'-oxydianiline (BPDA-ODA), 3,3',4,4'-benzophenone tetracarboxylic dianhydride-4,4'-oxydianiline (BTDA-ODA), or 3,3',4,4'-benzophenone tetracarboxylic dianhydride-bis aminophenoxy benzene-3-amino-phenyl-acetylene (BTDA-APB-APA) (THERMID*-Isoimide type--trademark of National Starch and Chemical Co.) have relatively high thermal coefficient of expansion (TCE), typically in the range of 30–60 ppm deg$^{-1}$ compared to 2–3 ppm deg$^{-1}$ in the case of inorganic materials (non-metallics) used in devices, substrates or packages such as silicon, ceramic, silicon oxide and silicon nitride, and 5–25 ppm deg$^{-1}$ in the case of commonly employed metallurgy. This TCE mismatch between the polyimide insulator and inorganic materials in device and packaging thin film multilayer structures results in the development of thermal stresses during high temperature processes in the fabrication cycle resulting in occasional problems of film cracking/delamination which presents a concern as to the performance reliability of end product. Yet another problem with the flexible chain polyimides is excessive swelling in polar solvents such as N-methylpyrrolidone (NMP) which can be a source of stress concentration at critical geometries such as sharp corners resulting in cracking/crazing phenomenon. The polyimide swelling has been found to be highly detrimental during thin film fabrication process especially when a non-compliant, rigid layer such as silicon nitride or silicon oxide is in contact with the underlying polyimide. It has been observed that in such cases, the inorganic film cracks due to excessive swelling of the polyimide underneath causing replication of the crack pattern into the polyimide as it has been observed after the silicon nitride is removed. Also, the flexible chain polyimides show relatively higher moisture uptake (up to 2–3%) which results in performance degradation, which may cause metal/insulator delamination and contributes to corrosion of contacting metallurgy.

Because of such limitations in the use of commonly known polyimides, there has been a great deal of interest recently in the development of low TCE/low stress polyimides for the purpose of generating stress-free multilevel interconnect structures in microelectronics in addition to other applications of these materials.

Y. Misawa et al., IEEE Transactions on Electron Devices, Vol. ED-34, No. 3, March 1987, describe a multilevel interconnection system for submicron VLSI's using multi-layered dielectric of plasma silicon oxide and low thermal expansion polyimide, PIQ-L100, which is used in conjunction with plasma CVD $SiO_2$. For surface planarization, an etch-back technique is described. The low TCE polyimide PIQ-L100 used in this application has been described to have the properties as listed in Table 1 in comparison to a flexible chain polyimide.

U.S. Pat. No. 4,690,999 (Hitachi) discloses uniaxially oriented low thermal expansion polyimides with special properties and a composite shaped article using the same.

TABLE 1

| Property | Unit | Low TCE-PI (PIQ L100) | Conv-PI (PIQ) |
|---|---|---|---|
| Density | (g/cm$^2$) | 1.47 | 1.38 |
| Coefficient of Thermal Expansion | (x 10–5 K-1) | 0.3 | 4.5 |
| Tensile Strength | (Kg/cm) | 39 | 13 |
| Tensile Elongation | (%) | 22 | 30 |
| Young's Modulus | (Kg/cm$^2$) | 1100 | 330 |
| Decomposition Temperature in Air | (° C.) | 510 | 440 |
| Activation Energy of Thermal Decomposition in Air | (kcal/Mol) | 50 | 35 |
| Absorbed Moisture Content | (%) | 1.3 | 2.3 |

U.S. Pat. No. 4,880,684 (IBM) discloses multilevel structure using glass-ceramic substrate which has capture pads on both sides to provide hermiticity. Multiple layers of flexible chain polyimides PMDA-ODA and BTDA-APB and interconnection metallurgy are formed on glass-ceramic such that capture pads formed on both sides of substrate are in alignment with the substrate vias and thru polyimide overlayers with the interconnection metallurgy between the underlying pad metallurgy, device chip, or pin bonded to surface of the layer.

U.S. Pat. No. 4,789,648 (IBM) discloses a method of producing multilevel metal/polyimide insulator films on a substrate and forming patterned conductive lines simultaneously with stud vias.

In the use of flexible chain polyimide insulators in microelectronics fabrication, it has been recognized that due to large differences in thermal expansion, there is fundamental incompatibility of these polymers with the inorganic and metal contacting materials in device structures. Therefore, frequent problems of cracking/crazing and/or delamination are encountered during the fabrication cycle or when the finished device is subjected to reliability testing conditions involving thermal excursions and T/H (temperature/humidity) or solvent exposures. From consideration of product performance including interface integrity at all levels of processing and end use, it is important that the polyimide insulator has the optimum functional characteristics in terms of thermal expansion match, thermal stability, mechanical properties, adhesion with contacting layers, lower dielectric constant, lower moisture uptake, minimal swelling in NMP, and other desirable features. In addition, successful fabrication of multilevel-metal structure using polyimides in conjunction with contacting materials of diverse properties requires that optimum set of process conditions be developed to provide problem-free fabrication and consistent product performance.

SUMMARY OF THE INVENTION

It is an object of the invention to provide high density interconnecting metal structures with low thermal expansion polyimide insulator/interlayer dielectric for problem-free fabrication and long-term performance and reliability of the end product.

It is also the object of this invention to provide a method for fabrication of multilayer metal structure with low TCE polyimide as insulator by sequential build of each metallized polyimide layer on a ceramic or silicon substrate. The low TCE polyimide according to this invention is made by curing the polyamic acid or the corresponding polyamic ester compositions which exhibit improved physical and mechanical properties, and improved performance as insulator and passivation layer in metallurgical structure network. Low TCE polyimide compositions with following special properties are disclosed in U.S. Pat. No. 5,115,090 to Sachdev, et al. the disclosure of which is hereby incorporated by reference into this application: low dielectric constant, low moisture uptake, minimal or no swelling in solvents such as NMP, low coefficient of thermal expansion, increased elongation at break (Eb), higher elastic modulus and ultimate tensile strength, abrasion resistance and superior polishing performance in generating planarized structures.

Said polyamic acid compositions, as disclosed in the above referenced Letters Patent, are reaction products of an aromatic monoanhydride endcapping compound with the reaction product of (a) a stoichiometric excess of a linear aromatic diamine selected from the group consisting of p-phenylene diamine, 4,4'-diaminobiphenyl, 2,2'-ditrifluoromethyl-4,4'-diaminobiphenyl, 4,4"-diaminoterphenyl, ditrifluoromethyl-4,4"-diaminoterphenyl, 3,3'dimethyl-4,4'-diaminobiphenyl, and 3,3',5,5'tetramethyl-4,4'-diaminobiphenyl, and (b) an aromatic compound selected from the group consisting of pyromellitic dianhydride and 3,3',4,4'-biphenictetracarboxylic dianhydride. It is also understood in the art that said corresponding polyamic ester compositions may be similarly obtained by substituting the corresponding diester diacyl chlorides for the cited dianhydrides, using known methods.

It is still a further object of this invention to provide multilayer metal structures using BPDA-PDA derived low TCE polyimide as insulator and passivation layer in conjunction with Cu or Al—Cu wiring and Cu, Al—Cu, or tungsten via metallurgy for metal/polyimide interconnections such that the composite structure has improved adhesion at all contacting surfaces which include polyimide/polyimide, metal/polyimide, and inorganic substrates (e.g. alumina ceramic, glass ceramic, alumina, mullite, silicon, aluminum nitride, $SiO_2$ or $Si_3N_4$)/polyimide. It is also the object of this invention to provide multilayer metal structure with low TCE polyimide which shows no problem of blistering, cracking, crazing, swelling, or delamination during the fabrication processes or under reliability testing environment including temperature/humidity excursions (cycling), and solvent cleaning operations eg., xylene/isopropanol exposure prior to chip join operation.

Yet another object of this invention is to provide multilayer metal structure with low TCE polyimide insulator whereby planarized scratch-free polyimide layers are formed by polishing or chemical-mechanical polishing, or other planarization techniques. The chemical-mechanical polishing techniques for removal of the conductive material overlaying photoresist are known in the art. Chow et al., in U.S. Pat. No. 4,702,792 describe simultaneous polishing of photoresist overlying PMDA-ODA polyimide layers and conductive material which is Al—Cu alloy, using slurry of alumina powder and dilute HNO3 at pH=3. Carr et al., U.S. Pat. No. 4,954,142 discloses methods of chem-mech polishing electronic component substrates which may comprise a glass ceramic substrate, copper studs and a polyimide film.

In accordance with the present invention, multilayer metal structures are provided having low residual stress, with no problem of solvent swelling, blistering, cracking or delamination under processing conditions and end use related stress exposures and which exhibit improved overall performance. These structures are fabricated using BPDA-PDA low TCE polyimide and related materials as insulator. According to a preferred embodiment of this invention, the BPDA-PDA polyamic acid compositions used for the fabrication of interconnection metallurgical network are derived from the condensation reaction of 3,3',4,4'-biphenic-dianhydride and p-phenylene diamine (BPDA-PDA). These compositions are prepared by an offset stoichiometry reaction using 100 mole parts of a linear aromatic diamine with 97 to 99.5 mole parts of an aromatic dianhydride in accordance with the procedure set forth in U.S. Pat. No. 5,115,090. After the reaction goes to completion, the resultant polyamic acid composition has residual amine groups present from the excess diamine used in the reaction. These reactive amine groups are stabilized or deactivated by the addition of an aromatic anhydride which reacts with these groups to form terminal amic acid functionality. The capped polyamic acid becomes storage stable having no residual amine reactive sites which could otherwise enter into reactions such as addition, chain scission, oxidation or other chemical changes which would be detrimental to product quality and interfere with the use of the composition to form polyamic acid films for later curing to form the corresponding polyimides. The properties of BPDA-PDA polyamic acid and fully cured polyimide derived therefrom are listed in Table 2.

DETAILED DESCRIPTION OF THE INVENTION

One method of forming thin film multilayer-metal structure with low TCE polyimide dielectric on ceramic substrate is comprised of following process sequence:

The first level metal or capture pads comprising Cr/Cu/Cr is deposited by sputtering and patterned by standard sub-etch through a photoresist mask. The substrate surface having first level metallurgy is subjected to $O_2$ plasma cleaning followed by treatment with a silane coupling agent as adhesion promoter such as 0.1% gamma—aminopropyl triethoxysilane (A1100) in alcohol, water, or mixtures thereof (95:5 ethanol-water is preferred). The BPDA-PDA polymer is then spin applied and baked/cured to 350–400° C. according to temperature cycle comprising 85° C./45 min, 140–150° C./45 min, 230–250° C./45 min, 300° C./45 min, and 350° C. or 400° C./60 min. This is followed by polishing or other planarization techniques. If necessary, a second layer of polyimide is formed on the first fully cured polyimide for which to assure good adhesion between the two layers, the first planarized polyimide surface is exposed to oxygen reactive ion etching ($O_2$ RIE) for 2–5 min at, for example, 200–300 watts, 100 sccm, and 100–300 mtorr oxygen pressure, (these conditions may be varied by those skilled in the art to meet this process or tool parameters) followed by application of adhesion promoter (0.1% A1100) and spin application of a second layer of BPDA-PDA, and bake/cure as above. Subsequent polishing or other planarization techniques are performed to obtain desired level of planarization. The polyimide is patterned to form via holes by laser ablation or by RIE (reactive-ion-etch method using expendable mask or MLR method known in the art), the ablated debris is removed by $O_2$ plasma ashing when laser ablation is used, and blanket depositing Cr as adhesion layer by RF sputtering followed by Cu sputter deposition or evaporation, and chemical-mechanical polishing to remove the overlying metal until the polyimide and the Cu via pattern is exposed and substantially planarized. Alternatively, metallization process may involve deposition of a Cr/Cu seed layer followed by copper plate-up and planarization as above.

TABLE 2

BPDA-PDA Polymer Properties as a function of solids content and stoichiometry offset A — Polyamic Acid Properties

| | | |
|---|---|---|
| Stoichiometry | 1:0.985 | 1:0.991 |
| Molecular Weight | 25,000 to 36,000 | 34,000 to 49,000 |
| % solids | 10.5–11.5 | 14.5–15.5 |
| Intrinsic Viscosity | 1.0–1.6 dL/g | 1.1–1.7 dL/g |
| Viscosity | 2200–3000 cSt | 30,000 to 35,000 cSt |
| Film Thickness @ 2000 rpm spin for 30 sec. & cure to 400° | 2.5–3.5 μm | 10.5–12.5 μm |

B — Polyimide Properties

| | | |
|---|---|---|
| Young's modulus (calculated @ 1% strain) | 9–12 GPa | 9–13 GPa |
| Film Thickness used | 8.5 μm (3 coats) | 8.5–10.5 μm (1 coat) |
| Ultimate Tensile Strength (UTS) | 500–580 MPa | 500–580 MPa |
| Elongation-at-Break (Eb %) | 35–55% | 35–55% |

Cross-head speed (strain rate)=0.5–2 mm/min
Glass Transition temperature>400° C. Thermal expansion measured by TMA method—Average TCE=5–6 ppm/° C. at 100° C. computed in 75–125° C. range.
Moisture uptake at equilibrium (24 hrs)<0.5% when exposed to ambient humidity (50% RH); under the same conditions, PMDA-ODA showed 2% $H_2O$ uptake (measured by the Thermogravimetric analysis method).
Dielectric constant as measured by the capacitor technique using Al—Cu/Polyimide insulator/Al—Cu dots: Er=2.9 at 1 MHz to 10 MHz; and 3.0 at 10 KHz to 100 KHz, dissipation factor=0.002 under the same conditions, PMDA-ODA derived polyimide has dielectric constant of 3.4–3.5.

Isothermal TGA of 400° C. cured BPDA-PDA polyimide at 400° C. in $N_2$ showed less than 0.01%/hr weight loss, while dynamic TGA (monitoring weight loss as a function of temperature) of the same polyimide showed no detectable weight loss up to 550° C. under $N_2$ ambient.

These polyimide films can be planarized by polishing techniques such as chemical-mechanical polishing or other planarization methods for removing the conductive layer on the top of metallized BPDA-PDA features to generate planar scratch-free polyimide/metal structure. This is in contrast to the scratch propensity and slower polishing rate of flexible chain polyimides such as PMDA-ODA under similar polishing conditions.

Also, the residual stress in these BPDA-PDA polyimide films cured on silicon wafers (measured by the x-ray wafer bending technique) was found to be 0 to 1000 psi for BPDA-PDA in comparison to 3000–4000 psi for films of polyimides with non-linear chain segments due to flexible linkage in the diamine segment, typically, PMDA-ODA, and 5000–6000 psi for polyimide derived from BTDA-ODA, and related polyimides which have flexible linkage both in the diamine and dianhydride used.

Multilayer metal structures using BPDA-PDA polyimide insulator were fabricated according to sequential build of each metallized layer whereby each subsequent layer is built by first forming polymer coating over the previous fully cured polyimide layer with conductive patterns. It is generally recognized in the art that high Tg polyimides such as the one derived from PMDA-ODA have the problem of polyimide-to-polyimide adhesion whenever subsequent coatings are to be formed on to 400° cured polyimide. We have found that this problem in obtaining good polyimide-to-polyimide adhesion is even more pronounced in the case of low TCE polyimides typically sBPDA-pPDA, sBPDA-Benzidine, PMDA-pPDA, PMDA-Benzidine, and related materials derived from planar rigid-rod precursors. These differences in adhesion characteristics between the two classes of polyimides may be due to relatively inert, lower energy surface of fully cured films of BPDA-PDA and related low TCE polyimides.

In the fabrication of the multilayer wiring structures according to this invention, polyimide-to-polyimide adhesion is achieved by surface activation of the first fully cured BPDA-PDA polyimide by $O_2$ RIE followed by application of gamma-aminopropyl triethoxysilane (A1100) as 0.1% solution in aqueous alcohol typically 95:5 ethanol-water mixture, or exposure of the surface activated films to A1100-HMDS (A1100-Hexamethyldisilazane) in Freon vapor.

EXAMPLE 1

(a) Low TCE Polyimide Coating on the Backside of Substrates (Stress Relief Layer/Passivation Layer):

Precleaned ceramic substrates are subjected to $O_2$ plasma for 10–15 min at 200–500 watts by placing the substrates in a glow chamber (or downstream asher), allowed to cool down to room temperature followed by spin application of the adhesion promoter, gamma-APS (gamma-aminopropyl triethoxysilane or A1100) as 0.1% solution in 95:5 ethanol-water, and BPDA-PDA polyamic acid having kinematic viscosity about 30,000 cSt, intrinsic viscosity about 1.1–1.7 dL/g, and 14–15% solids, is spin applied at 2000 rpm for 60 sec and baked at 85° C. for 45 min, and 140–150° C. for 45 min on a hot plate or in an oven purged with $N_2$, and curing at 230–250° C. for 30 min followed by 300° C. for 30 min, and 350–400° C. for 60 min in an oven or a programmed furnace purged with dry $N_2$ or forming gas ($N_2+H_2$). The fully cured polyimide thickness is typically 10–12 um.

(b) Low TCE Polyimide Coating on Topside of Substrate (Interlevel Dielectric and Passivation Layer):

Top side of the substrate is $O_2$ plasma cleaned for 10–15 min at 300–500 watts by placing the substrate in the glow chamber or downstream from the glow. The substrate is allowed to come to room temperature and then 0.1% A1100 solution as adhesion promoter is spin applied followed by application of BPDA-PDA polyamic acid as above and bake/cure up to 350–400° C. in inert ambient ($N_2$ or Forming gas). The first polyimide layer thus formed is polished to obtain substantially planarized surface. If necessary, a second coating of polyimide is formed according to the following process:

For good interlayer adhesion, the first layer is subjected to $O_2$ RIE for 2–5 min at 200–300 watts, 100–300 mtorr, and 100 sccm $O_2$ flow, such that a portion of the surface layer is removed leaving activated polyimide surface having preponderance of oxygenated carbon species. Adhesion promoter, 0.1% A1100 is applied (followed by drying at 85° C. for 10 min as an optional step), and a second layer of BPDA-PDA polyamic acid is applied and baked/cured as the first layer up to 350–400° C.

The composite polyimide layer is then subjected to a polishing operation which is continued until the requisite planarization is achieved. After polishing, the polyimide surface is cleaned by rinsing with deionized water, isopropyl alcohol, and again with DI water followed by drying in an oven at temperatures up to about 200° C. The via holes are formed in the polyimide layer by laser ablation. The carbon residue from the ablation is removed by $O_2$ plasma ashing or $O_2$ RIE. Conductive metal patterns are formed by blanket metallization by first depositing 200–400 Angstroms of an adhesion metal such as Cr, Ta, or Ti or Cr—Cu alloy followed by Cu deposition and chemical-mechanical polishing to coplanarize the via metallurgy with the low TCE polyimide dielectric layer with final thickness of about 12–15 um.

Next level Metallurgy

A thin layer of an adhesion metal eg., Cr, 200–400 Angstrom (or Cr/Cu/Cr layer can be used) is blanket deposited on the first level metal/polyimide structure described above. The metal surface is subjected to Ar+ ion bombardment (or sputter clean) followed by application of 0.1% A1100 as adhesion promoter, and then a layer of lift-off polyimide such as Ciba-Geigy Probimide* 284 or DuPont RC2566 is spin applied and baked up to 230° C. An $O_2$ RIE barrier layer, typically, plasma-polymerized hexamethyldisilazane (HMDS) or divinyltetramethyl disiloxane (DVS) is deposited over the lift-off polyimide, then a photoresist such as AZ1350J is applied, prebaked, and patterned according to standard expose/develop sequence. The resist pattern is transferred into the underlying barrier layer by $CF_4$ or $CF_4/O_2$ RIE when the resist serves as a mask. This is followed by $O_2$ RIE to replicate barrier pattern into the lift-off polyimide. Any RIE residues are removed by 10–30 sec rinse in 7:1 buffered HF followed by thorough rinse with deionized water. Subsequently, metallization is carried out by blanket metal deposition (eg., Cu/Ni/Au/Cr) by sputtering or evaporation and the lift-off stencil is removed by immersion in hot NMP (typically 85° C.) with or without agitation leaving the second level metal in contact with the first blanket metal over the via level metal which is embedded in the low TCE polyimide dielectric. The second level metal composite thickness is typically in the range 7–10 um. A resist layer is applied, prebaked, and imagewise exposed and developed such that the second level metal pattern remains protected while the blanket Cr (or Cr/Cu/Cr) is exposed in the remaining areas. The exposed metal is removed by standard sub-etch technique and then the protecting resist is removed. After this, the bottom side via holes are formed in the low TCE polyimide by laser ablation (or by RIE using expendable mask method) and ablation debris is removed by $O_2$ RIE or plasma ashing. Joining metal such as Cr/Cu/Ti/Au is evaporated through a mask to form I/O pads. This is followed by application of BPDA-PDA polyamic acid which is baked/cured to form low TCE polyimide as the passivation layer for the second level metallurgy. Via holes are formed in this polyimide layer by laser ablation (or by RIE again using the expendable mask method) and ablation debris is removed by $O_2$ RIE or plasma ashing. The exposed Cr film is removed by standard Cr etch process. This is followed by pin brazing and chip join to complete the multilevel metal structure with low TCE polyimide as dielectric and passivation layer.

EXAMPLE 2

Wiring Level Fabrication over a Stud Level

Starting with a structure having planar array of studs (eg., tungsten) embedded in insulator (eg., a low TCE polyimide), 500 Angstrom Ti is sputter deposited followed by 1000 Angstrom tungsten to serve as metal RIE etch barrier on which is deposited wiring metallurgy, typically, Ti (250 Å)/ Al—Cu (0.9 um)/ Ti (250 Å)/ Al—Cu (250 Å), where Al—Cu is 99.5% Al and 0.5% Cu. A photoresist such as AZ 1350J is then applied, prebaked, and exposed/developed to form negative pattern of desired wiring level. The imaged resist is UV hardened followed by metal RIE operation for Al—Cu, resist removal by $O_2$ RIE, surface clean with sodium metasilicate and $SF_6$ RIE to remove the exposed tungsten metal.

Next Stud Level:

After the first wiring level build, the surface is treated with A1100 (0.1% in 95:5 EtOH—$H_2O$ or MeOH—$H_2O$) as an adhesion promoter and then BPDA-PDA polyamic acid (formulation having kinematic viscosity about 2400 cSt, intrinsic viscosity 1.1–1.55, and 11–12% solids) is spin applied at 3000 rpm for 60 sec, baked at 110° C. for 20 min (hot plate), and cured at 200° C. for 30 min, 300° C. for 30 min and 400° C. for 60 min in a programmed furnace purged with forming gas. A planarizing layer comprising a low Tg polymer such as epoxy novolak is applied over the cured low TCE polyimide and baked to 200–230° C. An additional requirement for the low Tg planarizing layer is that it has essentially the same $O_2$ RIE rate as the underlying polyimide. Next operation involves etch back using $O_2$ RIE until a planarized polyimide layer remains having thickness of about 1.5 um. Subsequently, a polishing stop layer such as silicon nitride (2000 Angstroms) is deposited over which is applied a photoresist such as AZ 1350J (1 um). The resist is patternwise exposed and developed to form positive tone images of the desired via pattern, etched through the silicon nitride polish stop with $CF_4$ RIE, and then $O_2$ RIE to transfer via pattern into polyimide down to the Al(Cu) contact pads. The next step involves rinsing with 7:1 buffered HF for 10 sec and then thorough rinse with deionized water, followed by sputter clean with Ar+ ion bombardment and deposition of 100 Angstrom Ti/W over Al(Cu) pads, then deposition of 1.4 um CVD tungsten and polishing to form planar structure with polish stop still in place.

Next wiring level

Al(Cu) is deposited over the above structure and process steps are repeated to complete the device with alternating stud and wiring levels with low TCE polyimide as the interlevel dielectric and passivation layer.

EXAMPLE 3

Starting with a planar structure having array of metal studs, typically Cu, in the low TCE polyimide dielectric on a ceramic substrate, a thin seed layer metal, typically, Cr/Cu (200–300 Angstroms/1000–2000 Angstroms) is sputter deposited. A layer of photoresist such as AZ1350J is then applied, prebaked and patternwise exposed and developed corresponding to the desired next level metal pattern, followed by Cu plate-up using standard plating techniques to deposit 6–8 um plated metal. The resist is removed and the exposed seed metal is removed by wet etch. The Cu metal pattern is capped with an adhesion metal such as Cr (or alternate adhesion metal / diffusion barrier) according to standard method involving resist apply and lithography such that the plate-up metallurgy is exposed, resist hardening, Cr deposition, and resist removal. The surface is cleaned by $O_2$ plasma treatment and 0.1% A1100 solution is spin applied as an adhesion promoter. The higher viscosity BPDA-PDA polyamic acid formulation used in example 1 (a) is then spin applied over the metal topography and subjected to 145–175° C. bake, allowed to cool down to room temperature, and a second coat of the same formulation is applied followed by bake/cure up to 350–400° C. as described above in examples 1 and 2. The resulting structure has the polyimide dielectric in-between the metal features and a layer of polyimide over the metal features, the thickness differential of which depends on the extent of planarization. To form a fully planarized structure, the next operation involves polishing until the polyimide layer over the metal pattern is removed exposing the metal features and which are coplanar with the polyimide dielectric in-between the features.

EXAMPLE 4

An array of metal studs, typically, Cr/Cu/Cr (where Cu is the primary conductor and thin layer of Cr is used for adhesion) is formed on a ceramic substrate by standard MLR or Expendable mask method. According to this technique, a thick lift-off polymer layer (eg., Ciba-Geigy Probimide* XU284) is applied on the substrate and baked to 230° C., followed by $O_2$ RIE barrier layer and then a resist layer such as AZ1350J. The resist is exposed and developed according to the desired pattern which is etched into the barrier layer by $CF_4$ or $CF_4/O_2$ RIE and then the pattern is replicated into the underlying lift-off polyimide by $O_2$ RIE. Any residues after the RIE are removed by 10–30 sec rinse in 7:1 buffered HF followed by thorough rinse with deionized water, and baked at 100° C. for 30 min. Stud metal such as Cr/Cu/Cr is sputter deposited and then lift-off stencil is removed by immersion in NMP (at room temperature or 85° C. with or without agitation), rinsed with isopropanol, blow dried with $N_2$, and oven dried at 100° C. Over the topography of metal studs, BPDA-PDA polyamic acid is applied and baked/cured up to 350–400° C. to form polyimide insulator layer between the stud pattern with some thickness on the top of studs depending on the extent of planarization (for metal stud thickness greater than about 5 um, two applications of the polyamic acid are preferred with about 145–175° C. bake in-between coatings as used in example 3). Subsequent polishing operation is carried out until the stud metal is exposed and is coplanar with the polyimide dielectric layer between the studs.

EXAMPLE 5

An alternate thin film interconnect structure is formed by the following process.

(a) Backside Processing

A ceramic substrate having Cu metal thru vias and metal capture pads (or bonding pads) deposited on the bottom side of the ceramic substrate. The pad diameter is greater than the via dimension to insure complete coverage of the via locations. The backside surface is then cleaned by subjecting to $O_2$ plasma glow or by downstream ashing followed by the application of an adhesion promoter comprising a 0.1% solution of A1100 in 95:5 ethanol:water. A layer of BPDA-PDA polyamic acid or polyamic ester is applied on the treated surface and the coating is baked and cured to form polyimide as described in example 1.

(b) Top Side Processing

In a similar manner, metal capture pads of suitable diameter are formed on the top side of the ceramic substrate in registry with the ceramic thru vias. The top side surface is then subjected to $O_2$ plasma or downstream ashing followed by the application of the 0.1% solution of $A_{1100}$ adhesion promoter. First layer of BPDA-PDA polyamic acid or polyamic ester is then applied on this side and cured up to 350–400° C. to form polyimide. This first top side polyimide layer is polished to form a planarized surface followed by a cleaning step using deionized water and isopropanol to remove any particulate debris. To form a second polyimide layer, the first polished polyimide layer is subjected to $O_2$ RIE (reactive-ion-etching) followed by application of the 0.1% solution of A1100 adhesion promoter as above. Then a second layer of BPDA-PDA polyamic acid or polyamic ester is deposited on the surface treated polished polyimide layer and is cured to form polyimide. Subsequent polishing step is performed to achieve desired level of planarization which is again followed by surface cleaning operation as above to remove any residual particulates. Via holes are then formed on the topside composite polyimide layer by laser ablation. The debris from the ablation process is removed by $O_2$ plasma or downstream ashing. The patterned layer is then subjected to Ar+ ion bombardment, RF sputter clean, and blanket metallization by the sequential sputter deposition of 200–400 Angstrom Cr adhesion layer followed by bulk deposition of Cu. Subsequent chemical-mechanical polishing step is performed to remove excess metal and to planarize the structure so that Cu vias in alignment with the capture pads are co-planar with the BPDA-PDA dielectric layer.

Additional metal levels having alternating layers of wiring and stud features may be fabricated on this planar structure according to the process described in example 1 to form a multilayer thin film interconnect structure having low TCE polyimide as dielectric and passivation layer.

It is obvious to those skilled in the art that many modifications may be made within the scope of the present invention without departing from the spirit thereof, and the invention includes all modifications within the scope of appended claims.

What is claimed is:

1. A multilevel high density interconnect structure of a semiconductor device or package comprising:

a substrate having at least one conductive feature therein, a film of a polyimide composition formed on said substrate, wherein the polyimide composition has a low residual stress, an in-plane coefficient of thermal expansion in the range from 2 to 10 ppm/°C. at 100° C., a dielectric constant less then about 3.2 in the frequency range of about 10 KHz to about 10 MHZ, and an elongation at break of 35% to 55%, wherein the polyimide composition is selected from the group consisting of a cured product of a polyamic acid and a cured product of a polyamic ester, wherein said polyamic acid is prepared by reacting a stoichiometric excess of a linear aromatic diamine and an aromatic dianhydride to make a first reaction product where the molar ratio of said diamine to said anhydride is in the range from 100:97 to 100:99.5 and thereafter further reacting the first reaction product with an aromatic anhydride and said polyamic ester is prepared by reacting a stoichiometric excess of a linear aromatic diamine and an aromatic diester diacyl chloride to make a second reaction product where the molar ratio of said diamine to said diester diacyl chloride is in the range from 100:97 to 100:99.5 and thereafter further reacting the second reaction product with an aromatic anhydride, and at least one interconnective conductive metallurgical feature in said film of a polyimide composition in contact with said conductive feature in said substrate.

2. The structure of claim 1, wherein said polyamic acid is used and said diamine is selected from the group consisting of p-phenylene diamine, 4,4'-diaminobiphenyl, 2,2'-ditrifluoromethyl-4,4'-diaminobiphenyl, 4,4"-diaminoterphenyl, ditrifluoromethyl-4,4"-diaminoterphenyl, 3,3'-dimethyl-4,4'-diaminobiphenyl, and 3,3',5,5'-tetramethyl-4,4'-diaminobiphenyl, and said dianhydride is selected from the group consisting of pyromellitic dianhydride, 3,3',4,4'-biphenictetracarboxylic dianhydride, and mixtures thereof.

3. The structure of claim 1, wherein said polyamic ester is used and said diamine is selected from the group consisting of p-phenylene diamine, 4,4'-diaminobiphenyl, 2,2'-ditrifluoromethyl-4,4'-diaminobiphenyl, 4,4"-diaminoterphenyl, ditrifluoromethyl-4,4"-diaminoterphenyl, 3,3'-dimethyl-4,4'-diaminobiphenyl, and 3,3',5,5'-tetramethyl-4,4'-diaminobiphenyl, and said aromatic diester diacyl chloride is selected from the group consisting of pyromellitic diester diacyl chloride, biphenicdicarboxylic ester diacyl chloride, and mixtures thereof.

4. The structure of claim 1 wherein said film of a polyimide composition is defect-free and may be polished or planarized to form an essentially planar surface without scratching, pitting, and gouging.

5. The structure of claim 1 wherein said film of a polyimide composition exhibits negligible swelling in N-methyl-2-pyrrolidone, 2-methoxyethyl ether, gamma-butyrolactone, xylene or isopropyl alcohol.

6. A multilevel high density interconnect structure of a semiconductor device or package comprising:

a substrate having at least one conductive feature therein, a film of a polyimide composition formed on said substrate; wherein the polyimide composition has a low residual stress, an in-plane coefficient of thermal expansion in the range from 2 to 10 ppm/°C. at 100° C., a dielectric constant less then about 3.2 in the frequency range of about 10 KHz to about 10 MHZ, and an elongation at break of 35% to 55%; wherein the polyimide composition is formed by thermally curing on said substrate said polyamic acid prepared by a reaction of 100 mole parts of p-phenylene diamine and 98.0 to 99.5 mole parts of 3,3',4,4'-biphenictetracarboxylic dianhydride, dissolved in N-methyl-2-pyrrolidone which form a reaction product that is further reacted with an aromatic anhydride; and wherein said composition contains 9 to 20% solids with a 20,000 to 50,000 weight average molecular weight, a kinematic viscosity of 2200 to 36,000 centistokes, and an intrinsic viscosity of 1.0 to 1.7 dL/g; and at least one interconnective conductive metallurgical feature in said film of a polyimide composition in contact with said conductive feature in said substrate.

7. The structure of claim 1 wherein said film of a polyimide composition has deposited thereon a layer of a non-compliant inorganic film.

8. The structure of claim 7 wherein said non-compliant inorganic film is selected from the group consisting of silicon nitride, silicon oxide and silicon oxynitride.

9. The structure of claim 7 wherein said structure is resistant to cracking and crazing during a lift-off process.

10. The structure of claim 1 further comprising a conductive layer on a surface of said film of a polyimide composition other than the surface adhered to the substrate wherein said film of a polyimide composition is adhered directly to the conductive layer, the conductive layer being in contact with the interconnective conductive metallurgical feature.

11. The structure of claim 1 wherein said film of a polyimide composition is in contactwith a layer of a plasma-polymerized organometallic film of an organosilicon derived from the group consisting of hexamethyldisilazane, divinyltetramethyl-disoxane, tetraethoxysilane, methyltrialkoxysilane, vinyltrialkoxysilane and mixtures thereof.

12. A multilevel high density interconnect structure of a semiconductor package comprising:

a substrate having at least one conductive feature therein, a film of a polyimide composition formed on said substrate, wherein the polyimide composition has a low residual stress, an in-plane coefficient of thermal expansion in the range from 2 to 10 ppm/°C. at 100° C., a dielectric constant less then about 3.2 in the frequency range of about 10 KHz to about 10 MHZ, and an elongation at break of 35% to 55%, wherein the polyimide composition is selected from the group consisting of a cured product of a polyamic acid and a cured product of a polyamic ester, and wherein said polyamic acid is prepared by reacting a stoichiometric excess of a linear aromatic diamine and an aromatic dianhydride to make a first reaction product where the molar ratio of said diamine to said anhydride is in the range from 100:97 to 100:99.5 and thereafter further reacting the first reaction product with an aromatic anhydride and said polyamic ester is prepared by reacting a stoichiometric excess of a linear aromatic diamine and an aromatic diester diacyl chloride to form a second reaction product where the molar ratio of said diamine to said diester diacyl chloride is in the range from 100:97 to 100:99.5 and thereafter reacting the second reaction product with an aromatic anhydride, and at least one interconnective conductive metallurgical feature in said film of a polyimide composition in contact with said conductive feature in said substrate, said structure being essentially planar.

13. The structure of claim 12, wherein said polyamic acid is
used and said diamine is selected from the group consisting of p-phenylene diamine, 4,4'-diaminobiphenyl, 2,2'-ditrifluoromethyl-4,4'-diaminobiphenyl, 4,4"-diaminoterphenyl, ditrifluoromethyl-4,4"-diaminoterphenyl, 3,3'-dimethyl-4,4'-diaminobiphenyl, and 3,3',5,5'-tetramethyl-4,4'-diaminobiphenyl, and said
dianhydride is selected from the group consisting of pyromelliticdianhydride, 3,3',4,4'-biphenictetracarboxylic dianhydride, and mixtures thereof.

14. The structure of claim 12, wherein said polyamic ester composition is
used and said diamine is selected from the group consisting of p-phenylene diamine, 4,4'-diaminobiphenyl, 2,2'-ditrifluoromethyl-4,4'diaminobiphenyl, 4,4"-diaminoterphenyl, ditrifluoromethyl-4,4"-diaminoterphenyl, 3,3'-dimethyl-4,4'-diaminobiphenyl, and 3,3',5,5'-tetramethyl-4,4'-diaminobiphenyl, and said
diester diacyl chloride is selected from the group consisting of pyromellitic diester diacyl chloride, biphenicdicarboxylic ester diacyl chloride, and mixtures thereof.

15. The structure of claim 12 wherein said substrate is glass and said conductive feature is copper.

16. The structure of claim 12 wherein said substrate is alumina and said conductive feature is molybdenum.

17. The structure of claim 12 wherein said interconnective conductive metallurgical feature in contact with said conductive feature in said substrate comprise a top surface metallurgy of said structure.

18. The structure of claim 12 wherein said interconnective conductive metallurgical feature in contact with said conductive feature in said substrate comprise a bottom surface metallurgy of said structure.

19. The structure of claim 12 which further includes a conductive bonding pad in contact with said interconnective conductive metallurgical feature.

20. The structure of claim 18 wherein said film of a polyimide composition is used as a passivation layer.

21. The structure of claim 19 wherein said conductive bonding pad comprises copper metal sandwiched between layers of adhesion metal.

22. The structure of claim 21 wherein said adhesion metal is selected from the group consisting of chrome, tantalum, titanium, and co-deposited chrome/copper.

23. The structure of claim 17 wherein said film of a polyimide composition is used as an insulator layer.

24. The structure of claim 12 wherein said film of a polyimide composition is BPDA-PDA having in-plane thermal expansion from about 3 to about 6 parts per million per degree at 100° C.

25. The structure of claim 12 wherein the substrate is mullite and the conductive feature is tungsten.

26. The structure of claim 1 wherein said film of a polyimide composition is bonded to another polymer layer.

27. A multilevel high density interconnect structure of a semiconductor device comprising:
a substrate having at least one conductive feature therein,
a film of a polyimide composition formed on said substrate, wherein the polyimide composition has a low residual stress, an in-plane coefficient of thermal expansion in the range from 2 to 10 ppm/°C. at 100° C., a dielectric constant less then about 3.2 in the frequency range of about 10 KHz to about 10 MHZ, and an elongation at break of 35% to 55%, wherein the polyimide composition is selected from the group consisting of a cured product of a polyamic acid and a cured product of a polyamic ester, and wherein said polyamic acid is prepared by reacting a stoichiometric excess of a linear aromatic diamine and an aromatic dianhydride to make a first reaction product where the molar ratio of said diamine to said anhydride is in the range from 100:97 to 100:99.5 and thereafter further reacting the first reaction product with an aromatic anhydride and said polyamic ester is prepared by reacting a stoichiometric excess of a linear aromatic diamine and an aromatic diester diacyl chloride to make a second reaction product where the molar ratio of said diamine to said diester diacyl chloride is in the range from 100:97 to 100:99.5 and thereafter further reacting the second reaction product with an aromatic anhydride, and
at least one interconnective conductive metallurgical feature in said film of a polyimide composition in contact with said conductive feature in said substrate, said structure being essentially planar.

28. The structure of claim 27 wherein the substrate is selected from the group consisting of silicon, silicon/silicon oxide, and silicon/silicon nitride.

29. The structure of claim 27 wherein the substrate is a silicon device wafer and said at least one interconnective conductive metallurgical feature contained in said polyimide film is a metal stud array pattern.

30. The structure of claim 29 further comprising additional polyimide films over said film of a polyimide composition formed on the substrate, said additional polyimide films each containing an interconnective conductive metallurgical feature selected from the group consisting of a metal stud array pattern and a signal wiring metal pattern whereby said structure contains sequential alternating levels of a polyimide film containing a metal stud array and a polyimide film containing a signal wiring metal pattern.

31. The structure of claim 30 wherein (i) said metal stud arrays are comprised of a metal selected from the group consisting of low stress plasma enhanced CVD tungsten (PECVD), an Al/Cu alloy, or Cu and (ii) said signal wiring is comprised of a metal selected from the group consisting of (a) a Ti and Al/Cu alloy and (b) Cu.

* * * * *